United States Patent [19]
Xu et al.

[11] Patent Number: 6,033,961
[45] Date of Patent: Mar. 7, 2000

[54] ISOLATION TRENCH FABRICATION PROCESS

[75] Inventors: Jim-Jun Xu, Corvallis; Homayoon Haddad, Beverton, both of Oreg.

[73] Assignee: Hewlett-Packard Company, Palo Alto, Calif.

[21] Appl. No.: 09/071,051

[22] Filed: Apr. 30, 1998

[51] Int. Cl.[7] .................. H01L 21/336; H01L 21/76; H01L 21/302; H01L 21/461
[52] U.S. Cl. .................. 438/295; 438/424; 438/692
[58] Field of Search ................... 438/295, 424, 438/692

[56] References Cited

U.S. PATENT DOCUMENTS

| | | |
|---|---|---|
| 5,229,316 | 7/1993 | Lee et al. . |
| 5,712,185 | 1/1998 | Tsai et al. . |
| 5,923,992 | 7/1999 | Spikes et al. . |
| 5,926,713 | 7/1999 | Hause et al. . |
| 5,930,644 | 7/1999 | Tsai et al. . |
| 5,933,748 | 8/1999 | Chou et al. . |
| 5,940,716 | 8/1999 | Jin et al. . |
| 5,945,352 | 8/1999 | Chen et al. . |

*Primary Examiner*—John F. Niebling
*Assistant Examiner*—J. Jones

[57] ABSTRACT

Two steps of planarizing are performed during isolation trench fabrication resulting in a more uniform planarization of an integrated circuit substrate. A protective layer deposition and a planarizing step are performed prior to a final planarizing step. Applying protective material fills in a portion of recesses in a dielectric layer overlying isolation trench areas. A first global planarization process eliminates narrower recesses and shallows out deeper recesses without causing dishing in the dielectric material. Much of the protective material is removed by the first global planarization process. The remaining protective material is stripped. A final global planarization process then is performed which removes dielectric material outside of the trench areas. A well-defined border of the trenches results.

9 Claims, 2 Drawing Sheets

ISOLATION TRENCH FABRICATION PROCESS

BACKGROUND OF THE INVENTION

This invention relates generally to semiconductor fabrication processes, and more particularly to a method for planarizing integrated circuit surfaces where isolation trenches are used.

An area of a semiconductor substrate where a device or a part of a device is formed is referred to as an active area. For the device to exhibit desired characteristics, the active areas of respective devices are to be isolated. Isolation of devices typically is achieved by using local oxidation techniques or trench isolation techniques. Local oxidation techniques employ a thick film of oxidation material serving as a barrier between active areas. In trench isolation techniques a trench is formed between active areas of adjacent devices. The trench is filled with a dielectric or oxide material. An advantage of trench isolation is the avoidance of topographical irregularities typically encountered using local oxidation techniques. A difficulty of local oxidation is the encroachment of the oxide into the active areas, referred to in the art as bird's beak effect. Using trench isolation techniques, increased packing density and higher speed devices are achievable.

In forming isolation trenches deposition of a dielectric and subsequent polishing can result in a very irregular surface. If the irregularity is excessive, anomalous device leakage, reduced isolation integrity and subsequent metallization defects can occur. As this irregularity can be magnified during subsequent fabrication processes, it is important that the substrate and isolation trenches be as planar as possible.

Various types of isolation trenches are known in the art. Deep narrow trenches are used to isolate one device from another. Shallow trenches are used to isolate individual elements within a device (e.g., to isolate a drain from a source in a MOSFET). Wide trenches are used in areas where metallization patterns are to be deposited. Shallow, deep and wide trenches can be used interchangeably to isolate devices and parts thereof. These trenches are filled with dielectric materials such as silicon dioxide or silicon nitride using conformal deposition processes (e.g., chemical vapor deposition).

Isolation trench techniques include a planarization process which removes dielectric materials from the active areas while maintaining the dielectric materials in the trenches. While a narrow trench and closely packed trenches may be relatively easy to planarize, a wide trench or sparsely packed trenches may be more difficult. In particular, a process used to planarize a narrow trench may remove much of the dielectric from the wider trench. Because of the differing width of trenches, uniform planarization is difficult to achieve. Accordingly, there is a need for an isolation trench fabrication process which achieves uniform planarization.

SUMMARY OF THE INVENTION

According to the invention, two steps of planarizing are performed during isolation trench fabrication resulting in a more uniform planarization of an integrated circuit substrate upon completion of the isolation trench fabrication process.

According to one aspect of the invention, a protective layer deposition step and a planarizing step have been added prior to a final planarizing step. During isolation trench fabrication, trench openings are etched through a nitride layer into the substrate. A layer of dielectric material then is applied to the substrate filling in the trench and covering the nitride layer. Recesses occur in the dielectric layer. Dishing caused by planarization of the dielectric layer in prior fabrications process resulted in defects as described in the background section (e.g., anomalous device leakage, reduced isolation integrity and subsequent metallization defects). The inventive step of applying the protective material fills in a portion of the recesses in the dielectric layer overlying the trench areas. A first global planarization process then eliminates narrower recesses and shallows out deeper recesses without causing dishing in the isolation dielectric material. Much of the protective material is removed by the first global planarization process. Protective material remains in the deep recesses of the dielectric layer.

According to another aspect of the invention, after the first planarization process, the remaining protective material is stripped. A final global planarization process then is performed. During this process, the dielectric material outside of the trench areas is removed. Well-defined borders of the trench results. The lateral, distal portions of the trench filling (i.e., remaining dielectric material) are bordered by a nitride layer over the substrate. This material is harder than the dielectric material. Thus, during the second planarization the dielectric material is removed to a level below the nitride layer. Once the nitride layer is stripped a well-defined border of the dielectric material remains.

Thus, an advantage of the invention is that effective isolation trenches are achieved. These and other aspects and advantages of the invention will be better understood by reference to the following detailed description taken in conjunction with the accompanying drawings.

DESCRIPTION OF SPECIFIC EMBODIMENTS

Figure 1:
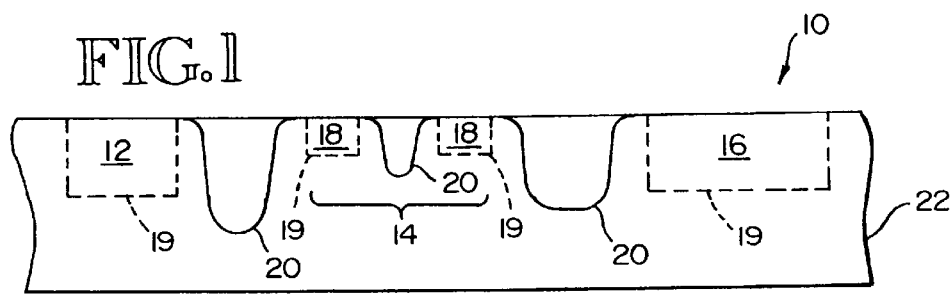
FIG. 1 is a partial cross-section of an integrated circuit wafer after isolation trench fabrication and semiconductor device fabrication.

FIG. 1 shows a cross-section of a portion of an integrated circuit wafer 10 including a plurality of devices 12, 14, 16. The device 14 includes a plurality of components 18. The term "active area" as used herein means an area 19 of the wafer 10 within which either a device or a device component is formed. Isolation trenches 20 are formed between the active areas so as to achieve higher device packing density and faster device speeds. Although, trenches of different depth may be formed as illustrated, in a preferred embodiment each trench 20 is to the same depth. FIGS. 2–9 show a portion of the wafer at various steps during an isolation trench fabrication process according to an embodiment of this invention. Typically the isolation trench fabrication process is performed prior to the device fabrication processes, or is intermixed with steps of the device fabrication process.

Figure 2:
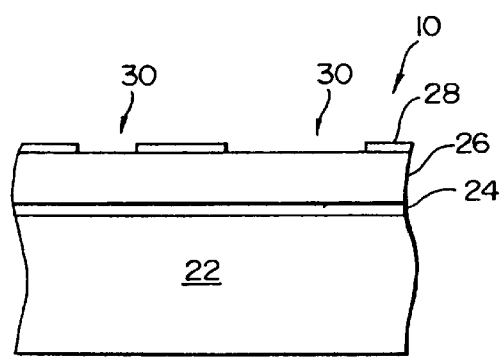
FIG. 2 is a partial cross-section of the wafer of FIG. 1 in the process of fabricating an isolation trench.

Initially a bare or partially doped silicon substrate 22 is cleaned and prepared for processing. Referring to FIG. 2, a layer 24 of oxide material or another insulating material then is applied (e.g., grown) during a stress relief oxidation deposition process. Exemplary materials include silicon dioxide, and $Si_3N_4$. A layer 26 of protective material (e.g., a nitride material) then is applied (e.g., deposited) onto the oxide layer 24. A layer of photoresist 28 then is applied over the nitride layer 26. The photoresist layer is exposed using a desired mask to define areas of photoresist 28 with window areas 30 which reveal portions of the nitride layer 26.

Figure 3:
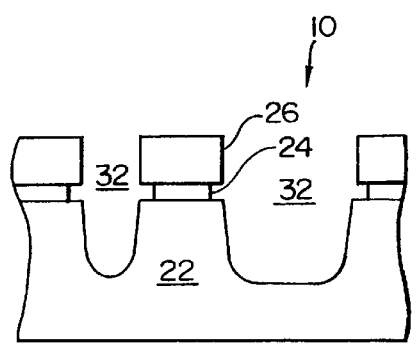
FIG. 3 is a partial cross-section of the wafer-in-process of FIG. 2 after etching isolation trench openings.
Figure 4:
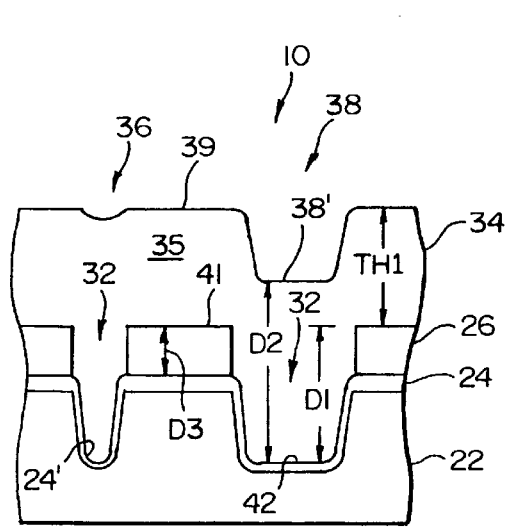
FIG. 4 is a partial cross-section of the wafer-in-process of FIG. 3 after globally applying a layer of dielectric material to fill in the trench openings.

Referring to FIG. 3, a trench etch step then is performed to form trench openings 32 in the window areas 30. In one or more etching processes, the openings 32 are etched through the nitride layer 26, the oxide layer 24 and into the substrate 22. Thereafter, the photoresist 28 is stripped using either a wet or a dry stripping process. Next, the oxide layer 24 is cleaned within the trench areas 32 and pulled back in part away from the corresponding edges of the nitride 28 and substrate 22 using an oxide precleaning process. Referring to FIG. 4, an oxide layer 24' then is applied (e.g., grown) lining the trench opening 32 along the substrate 22. Either the same or a different insulating material is used for layer 24' as for layer 24.

A trench fill process then is performed in which dielectric material 35, such as an oxide material, is deposited into the trench openings 32 and onto the nitride layer 26. Exemplary dielectric materials include oxides, subatmospheric CVD, PECVD, or high density plasma oxide. A layer 34 of the dielectric material is shown in FIG. 4. The deposition process typically causes a uniform amount of material to be deposited. Because the contour surface to which the dielectric material 35 is deposited is not planar, the layer 34 does not have a planar contour. As shown in FIG. 4, there are recesses 36, 38 in the layer 34 overlaying the trench areas 32. The recesses 38 over wider trenches extend deeper than the recesses 36 over narrower trenches.

After the dielectric material 35 is deposited, the distal surface 39 of the layer 34 is cleaned and decontaminated. An annealing step then is performed during which the wafer-in-process 10 is heated in a furnace. The heating causes the dielectric material 35 to become denser adding to the non-planarity of the distal surface 39 of layer 34.

After the annealing step, the layer 34 has a thickness TH1 at a portion over the nitride layer 26 which is greater than the depth D1 of the trench opening 32 from a distal surface 41 of the nitride layer 26 to the base 42 of the trench area 32, (i.e., TH1>D1). Preferably the dielectric material 35 extends for a thickness D2 at the dielectric layer's 34 lowest contour 38' which is greater than thickness D1, (i.e., D2>D1). The thickness D2 extends from the base 42 of the trench 32 to the surface 38' within the deepest recess 38. In some embodiments the thickness D2 is greater than the thickness D1 by a distance which approximates the thickness D3 of the nitride layer 26, (i.e., D2−D1≈D3). Preferably thickness D2−D1 is greater than or equal to one-half the thickness D3, (i.e., D2−D1≧(0.5*D3). For a wide trench the thickness D2 is the same as the thickness TH1.

Figure 5:
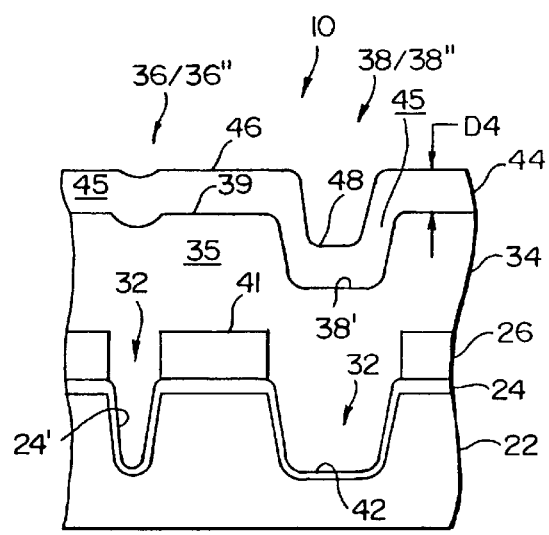
FIG. 5 is a partial cross-section of the wafer-in-process of FIG. 4 after globally applying a protective layer over the dielectric layer.

Referring to FIG. 5, a layer 44 of protective material 45 (e.g., a nitride material or other material as listed for the prior protective layer 26) is applied to the wafer-in-process 10 over the dielectric layer 34 after the annealing step. Such material may be the same or different than the material of layer 26. The distal surface 46 of protective layer 44 includes recesses 36", 38" overlaying the recesses 36, 38. The effect of the protective layer 44 is to decrease the area of the recesses 36, 38, and in particular to decrease the length/width or diameter of the recesses 36, 38. At the deepest portion of the deepest recess 38" in layer 44, the distal surface has part number 48. The thickness of the protective layer 44 is thickness D4.

Figure 6:
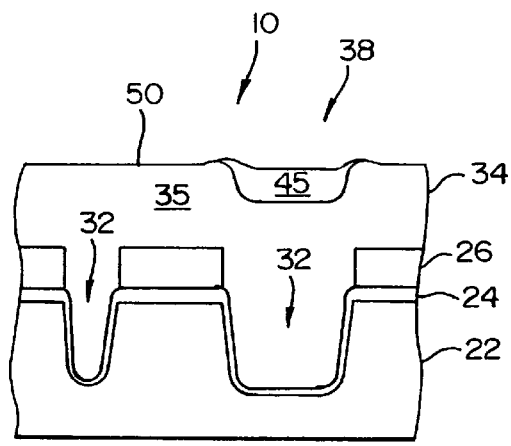
FIG. 6 is a partial cross-section of the wafer-in-process of FIG. 5 after a first global planarization process.

Referring to FIG. 6, a first global planarizing process (e.g., mechanical planarization or chemical mechanical planarization) then is performed on the wafer-in-process 10. In some embodiments the planarizing reaches to at least the surfaces 39 and 48. In other embodiments the planarizing reaches past the surface 48. In other embodiments the planarizing reaches to within a few hundred angstroms of the surface 48. Preferably, the planarizing step removes material 45 and 35 down to an approximate depth of the surface 48 of the deepest recess 38" as shown in FIG. 6. The effect of the layer 44 deposition and the global planarization is to eliminate the shallower recesses 36, 36", while protecting against dishing of the deeper recesses 38, 38". Preferably the protective material 45 is harder than the dielectric material 35. This allows the dielectric material 35 adjacent to the shallower recesses 36 to be removed countering any dishing of the protective material 45 in recess 36".

After the global planarization step, the distal surface 50 of the wafer-in-process includes the dielectric material 35 in many portions and the protective material 45 in deep recess 38, 38" portions. Note that the contour of the distal surface 50 is more planar than the contour of the distal surface 39 after the trench filing step, but still not completely planar. Some dishing of the protective material 45 occurs within the recess 38 without dishing of the dielectric material 35 bordering the protective material 45.

Figure 7:
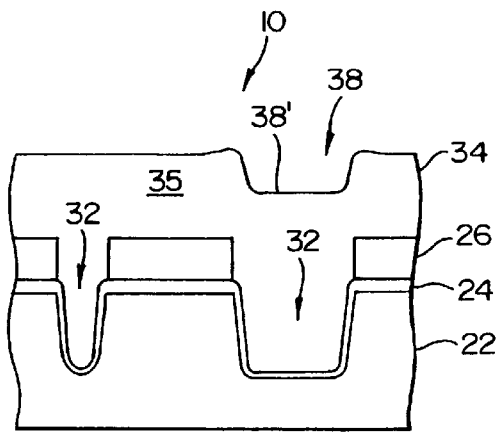
FIG. 7 is a partial cross-section of the wafer-in-process of FIG. 6 after stripping the protective layer.
Figure 8:
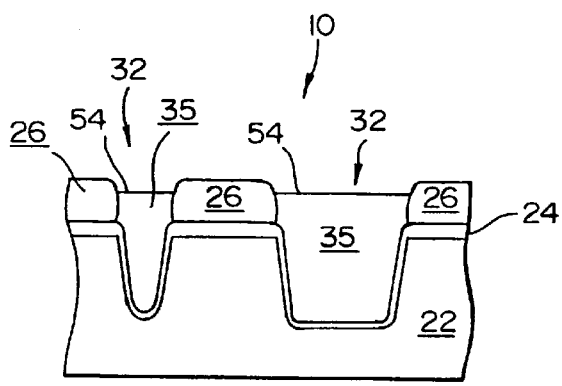
FIG. 8 is a partial cross-section of the wafer-in-process of FIG. 7 after performing a final global planarization process.
Figure 9:
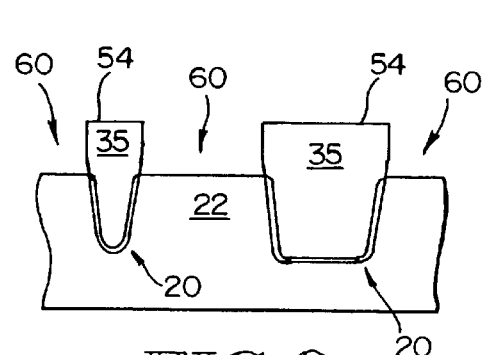
FIG. 9 is a partial cross-section of the wafer-in-process of FIG. 8 after completing the trench isolation fabrication.

Referring to FIG. 7, a wet stripping process is performed after the global planarization to remove the protective material 45 from the distal surface 50 of the wafer-in-process (i.e., from what is left of recess 38). Next, a second global planarization process (e.g., mechanical planarization or chemical mechanical planarization) is performed on the wafer-in-process 10. Referring to FIG. 8, the second global planarization process removes the dielectric layer 34 over the portions of the nitride layer 26, and in some embodiments thins the nitride layer 26. Preferably the dielectric material 35 is softer than the nitride material 26. Upon completion of the second global planarization step, the distal surfaces 54 of the dielectric material 35 within the trenches 32 are generally planar and at no higher a level than the remaining nitride layer 26. The exposed surfaces 54, 26 then are cleaned and decontaminated. Referring to FIG. 9, the remaining portions of the nitride layer 26 and the underlying portions of the oxide layer 24 are stripped. In some embodiments only the nitride layer 26 portions are stripped. In some embodiments the stripping is performed prior to the step of cleaning and decontaminating the distal surface 54 of the dielectric material 35 within the trench areas 32.

FIG. 9 shows a portion of the wafer-in-process 10 upon completion of the trench isolation fabrication process.

Thereafter, device fabrication processes are performed to achieve the integrated circuit wafer 10 of FIG. 1 having various devices 14, 16, 18, active areas 19 and isolation trenches 20. The isolation trenches 20 are the trenches of FIG. 9 as filled with the dielectric material 35. Doping and formation of gates, wiring lines, interconnects, contacts and vias occurs in the areas 60 in and over substrate 22 between the trenches 20 to define the active areas 19 (see FIG. 1) of devices 12, 14, 18 and device components 14.

Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. A method for forming a trench in a semiconductor substrate which serves to isolate adjacent semiconductor device regions, the method comprising the steps of:

etching an isolation trench through a first layer of a wafer-in-process into the semiconductor substrate;

depositing a second layer of a first material onto the first layer and into the isolation trench, wherein an outer surface of the second layer is contoured to have a recess in alignment with the isolation trench;

depositing a third layer of a second material over the second layer, wherein an outer surface of the third layer is contoured to have a recess in alignment with the second layer recess and the isolation trench;

after the step of depositing the third layer, globally planarizing along the outer surface of the wafer-in-process down to at least the second layer while leaving second material in the second layer recess;

after the step of planarizing, stripping the second material from the second layer recess; and after the step of stripping, globally planarizing the wafer-in-process at least to the first layer, while leaving first material in the isolation trench.

2. The method of claim 1, further comprising, after the step of globally planarizing the wafer-in-process at least to the first layer, the step of stripping the first layer.

3. The method of claim 1, further comprising the step of forming semiconductor devices adjacent to the isolation trench.

4. A method for forming isolation trenches in a semiconductor substrate which serves to isolate adjacent semiconductor device regions, the method comprising the steps of:

etching a plurality of isolation trenches through a first layer of a wafer-in-process into the semiconductor substrate;

depositing a second layer of a first material onto the first layer and into the isolation trenches, wherein an outer surface of the second layer is contoured to have recesses in alignment with corresponding isolation trenches;

depositing a third layer of a second material over the second layer, wherein an outer surface of the third layer is contoured to have recesses in alignment with the second layer recesses and the isolation trenches;

after the step of depositing the third layer, globally planarizing along the outer surface of the wafer-in-process down to at least the second layer while leaving second material in at least one of the second layer recesses;

after the step of planarizing, stripping the second material from said at least one second layer recess; and after the step of stripping, globally planarizing the wafer-in-process at least to the first layer, while leaving first material in the isolation trenches.

5. The method of claim 1, further comprising, after the step of globally planarizing the wafer-in-process at least to the first layer, the step of stripping the first layer.

6. The method of claim 4, further comprising the step of forming semiconductor device components between and adjacent to the isolation trenches.

7. A method for forming isolation trenches in a semiconductor substrate, each isolation trench serving to isolate adjacent semiconductor device regions, the method comprising the steps of:

etching a plurality of isolation trenches through a plurality of first layers of a wafer-in-process and into the semiconductor substrate;

depositing a second layer of a first material onto the first layer and into the plurality of isolation trenches, wherein an outer surface of the second layer is contoured to have a plurality of recesses, each one of the plurality of recesses aligned with a corresponding one of the plurality of isolation trenches;

depositing a third layer of a second material over the second layer, wherein an outer surface of the third layer is contoured to have a plurality of recesses, each one of the plurality of third layer recesses aligned with a corresponding one of the plurality of second layer recesses and isolation trenches;

after the step of depositing the third layer, globally planarizing along the outer surface of the wafer-in-process down to at least the second layer while leaving second material in at least one recess of the second layer recesses;

after the step of planarizing, stripping the second material from said at least one second layer recess; and after the step of stripping, globally planarizing the wafer-in-process at least down to one of the plurality of first layers, while leaving first material in each one of the plurality of isolation trenches.

8. The method of claim 7, further comprising, after the step of globally planarizing the wafer-in-process at least to the first layer, the step of stripping at least one of the plurality of first layers.

9. The method of claim 7, further comprising the step of forming semiconductor device components between and adjacent to the isolation trenches.

* * * * *